US005656078A

United States Patent [19]
Fuerhoff

[11] Patent Number: 5,656,078
[45] Date of Patent: Aug. 12, 1997

[54] NON-DISTORTING VIDEO CAMERA FOR USE WITH A SYSTEM FOR CONTROLLING GROWTH OF A SILICON CRYSTAL

[75] Inventor: Robert H. Fuerhoff, St. Charles, Mo.

[73] Assignee: MEMC Electronic Materials, Inc., St. Peters, Mo.

[21] Appl. No.: 558,609

[22] Filed: Nov. 14, 1995

[51] Int. Cl.$^6$ ............................................. C30B 35/00
[52] U.S. Cl. ................. 117/201; 117/202; 250/559.07; 364/560
[58] Field of Search ..................... 117/13, 14, 15, 117/200, 201, 202; 250/559.07, 559.08; 364/560, 564

[56] References Cited

U.S. PATENT DOCUMENTS

| | | | |
|---|---|---|---|
| 3,740,563 | 6/1973 | Reichard | 117/15 |
| 4,350,557 | 9/1982 | Scholl et al. | 117/25 |
| 4,710,258 | 12/1987 | Latka | 117/15 |
| 4,926,357 | 5/1990 | Katsuoka et al. | 364/560 |
| 5,138,179 | 8/1992 | Baba et al. | 117/15 |
| 5,170,061 | 12/1992 | Baba | 250/561 |
| 5,178,720 | 1/1993 | Frederick | 117/20 |
| 5,240,684 | 8/1993 | Baba et al. | 117/14 |
| 5,437,242 | 8/1995 | Hofstetter et al. | 117/14 |

FOREIGN PATENT DOCUMENTS

| | | | |
|---|---|---|---|
| 0450502A1 | 10/1991 | European Pat. Off. | C30B 15/26 |
| 63-239181 | 10/1988 | Japan | C30B 15/26 |
| 63-256594 | 10/1988 | Japan | C30B 15/26 |
| 3-112885 | 5/1991 | Japan | C30B 15/26 |
| 4-300283 | 10/1992 | Japan | C30B 15/20 |

OTHER PUBLICATIONS

Video Magnifiers; Edmund Scientific; 1994 Catalog.

Optics and Optical Instruments; B.K. Johnson; 1960; pp. 110–113.

Gonzalez and Wintz; Digital Image Fundamentals; 1987; pp. 35–53.

PC–Nikkor 28 mm f/3.5 Nikon Instruction Manual (Date unavailable).

*Primary Examiner*—Felisa Garrett
*Attorney, Agent, or Firm*—Senniger, Powers, Leavitt & Roedel

[57] ABSTRACT

System for determining the diameter of a silicon crystal being pulled from a silicon melt for controlling a silicon crystal growing apparatus. The melt has a planar surface including a meniscus that is visible as a bright ring adjacent the crystal. A camera positioned above the melt surface and away from the crystal includes an image plane that is generally parallel to the melt surface and responsive to light from the bright ring for generating an image pattern of a portion of the bright ring. As such, the camera compensates for distortion of the image pattern caused by the position of the camera relative to the crystal. Image processing circuitry detects a characteristic of the image pattern and defines an edge of the bright ring as a function of the detected characteristic. The image processing circuitry further defines a generally circular shape including the defined edge of the bright ring. The diameter of the crystal is then determined based on the diameter of the defined shape for use in controlling the crystal growing apparatus.

17 Claims, 6 Drawing Sheets

NON-DISTORTING VIDEO CAMERA FOR USE WITH A SYSTEM FOR CONTROLLING GROWTH OF A SILICON CRYSTAL

BACKGROUND OF THE INVENTION

This invention generally relates to an improved camera and, particularly, to a perspective-controlled video camera for use with a system for measuring the diameter of silicon crystals grown by the Czochralski process to control an apparatus or method employing the Czochralski process.

Crystal pulling machines employing the Czochralski process produce the substantial majority of monocrystalline silicon used to make silicon wafers for the microelectronics industry. Briefly described, the Czochralski process involves melting chunks of high-purity polycrystalline silicon in a quartz crucible located in a specifically designed furnace to form a silicon melt. The lower end of a pull wire hanging from a crystal lifting mechanism suspends a relatively small seed crystal above the crucible. The crystal lifting mechanism lowers the seed crystal into contact with the molten silicon in the crucible. When the seed begins to melt, the mechanism slowly withdraws it from the silicon melt. As the seed is withdrawn, it grows drawing silicon from the melt. During the growth process, the crucible rotates in one direction while the crystal lifting mechanism, wire, seed, and crystal rotate in an opposite direction.

As crystal growth is initiated, the thermal shock of contacting the seed with the melt may cause dislocations in the crystal. Unless eliminated in the neck region between the seed crystal and the main body of the crystal, the dislocations propagate throughout the growing crystal and multiply. The known methods of eliminating dislocations within silicon single crystal involve growing a neck having a small diameter at a relatively high crystal pull rate to completely eliminate dislocations before growing the body of the crystal. After dislocations are eliminated in the neck, its diameter is enlarged until the desired diameter of the main crystal body is reached. When the neck, which is the weakest part of the crystal, has too small of a diameter, it can fracture during crystal growth, causing the body of the crystal to drop into the crucible. The impact of the crystal ingot and splashing molten silicon can cause damage to the crystal growing apparatus as well as present a serious safety hazard.

As is known in the art, the Czochralski process is controlled, in part, as a function of the diameter of the crystal being grown. Thus, for both control and safety reasons, an accurate and reliable system for measuring crystal diameter, including neck diameter, is needed.

Several technologies are known for providing crystal diameter measurements, including methods of measuring the width of the bright ring. The bright ring is a characteristic of the reflection of the crucible wall in the meniscus which is formed at the solid-liquid interface. Conventional bright ring and meniscus sensors employ optical pyrometers, photocells, rotating mirrors with photocells, light sources with photocells, line-scan cameras, and two-dimensional array cameras. U.S. Pat. Nos. 3,740,563, 5,138,179 and 5,240,684, the entire disclosures of which are incorporated herein by reference, disclose methods and apparatus for determining the diameter of a crystal during the crystal growth process.

Presently available apparatus for automatically measuring crystal width, however, are often not sufficiently accurate or reliable for use during the different phases of crystal growth or for large diameter crystals in which the true maximum of the bright ring may be obscured from view by the solid body of the crystal itself. In an effort to correct this problem, apparatus for measuring crystal width attempt to measure the meniscus at a chord or at a single point along the meniscus. However, such apparatus require precise mechanical positioning of the scanning device and are highly sensitive to fluctuations in melt level. Further, conventional measuring apparatus require frequent calibration by the operator of the crystal growing apparatus to ensure that the diameter remains within specification.

Crystal measuring apparatus typically include a camera, such as a monochrome charge coupled device (CCD) camera, mounted in a viewport of the crystal growing chamber at an angle with respect to the axis of the growing crystal. The camera generates a video image of the crystal including an image of the meniscus at the interface between the silicon melt and the crystal. A disadvantage of such apparatus is that the position of the camera causes perspective distortion so that the image of the meniscus appears elliptical rather than circular. Although mathematical transformations are available for extracting a circular shape from a distorted elliptical shape to compensate for perspective distortion, such transformations are complicated and delay the performance of a vision system processing the image of the meniscus.

Commonly assigned application Ser. No. 08/459,765, filed Jun. 2, 1995, the entire disclosure of which is incorporated herein by reference, provides improvements in vision systems for use in measuring crystal diameter during the growing process. Although the system and method of application Ser. No. 08/459,765 provide improved crystal diameter measurements, there is still a need for a system that compensates for perspective distortion without the use of complicated transformations and additional processing steps by the vision system.

Telecentric lenses solve a related problem in which the field of view contains three-dimensional objects that are off-axis to the lens. However, the telecentric lens is only effective when the field of view is less than or only slightly greater than the diameter of the objective lens. As such, camera tilting or panning is still required when measuring objects that are outside the field of view.

For these reasons, conventional apparatus fail to provide a sufficiently accurate and reliable system of automatically determining crystal diameter for controlling the crystal growth process that compensates for perspective distortion.

SUMMARY OF THE INVENTION

Among the objects and features of the present invention may be noted the provision of an improved system which overcomes the disadvantageous conditions described above; the provision of such system which provides accurate and reliable measurements of crystal diameter during the growth process; the provision of such system which compensates for errors caused by distortion due to camera angle; and the provision of such system which is economically feasible and commercially practical.

Briefly described, a system embodying aspects of the present invention is for use in combination with an apparatus for growing a silicon crystal from a silicon melt. The system determines a dimension of the silicon crystal being pulled from the silicon melt wherein the melt has a generally planar surface including a meniscus that is visible as a bright area adjacent the silicon crystal. The system includes a camera positioned above the silicon melt surface and away from the silicon crystal. The camera includes a lens for receiving and transmitting light from the bright area adjacent the crystal and an image plane responsive to the light transmitted by the lens for generating an image pattern of a portion of the bright area. The image plane is generally parallel to the silicon melt surface thereby to compensate for distortion of the image pattern caused by the position of the camera relative to the silicon crystal. The system also includes a detection circuit for detecting a characteristic of the image pattern and a defining circuit for defining an edge of the bright area as a function of the detected characteristic and for defining a shape including the defined edge of the bright area. A measurement circuit then determines a dimension of the defined shape whereby the dimension of the silicon crystal is determined as a function of the determined dimension of the defined shape.

In another form, a system embodying aspects of the present invention is for use in combination with an apparatus for growing a silicon crystal from a silicon melt. The system determines a dimension of the silicon crystal being pulled from the silicon melt wherein the melt has a generally planar surface including a meniscus that is visible as a bright area adjacent the silicon crystal. The crystal is pulled from the melt generally along a vertical axis within the meniscus which is generally perpendicular to the melt surface. The system includes a camera positioned above the silicon melt surface and away from the vertical axis. The camera includes a lens for receiving and transmitting light from the bright area adjacent the crystal and an image plane responsive to the light transmitted by the lens for generating an image pattern of a portion of the bright area. The camera also includes an optical axis that is generally parallel to the vertical axis thereby to compensate for distortion of the image pattern caused by the position of the camera relative to the vertical axis. The system also includes a detection circuit for detecting a characteristic of the image pattern and a defining circuit for defining an edge of the bright area as a function of the detected characteristic and for defining a shape including the defined edge of the bright area. A measurement circuit then determines a dimension of the defined shape whereby the dimension of the silicon crystal is determined as a function of the determined dimension of the defined shape.

Alternatively, the invention may comprise various other systems and/or methods.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
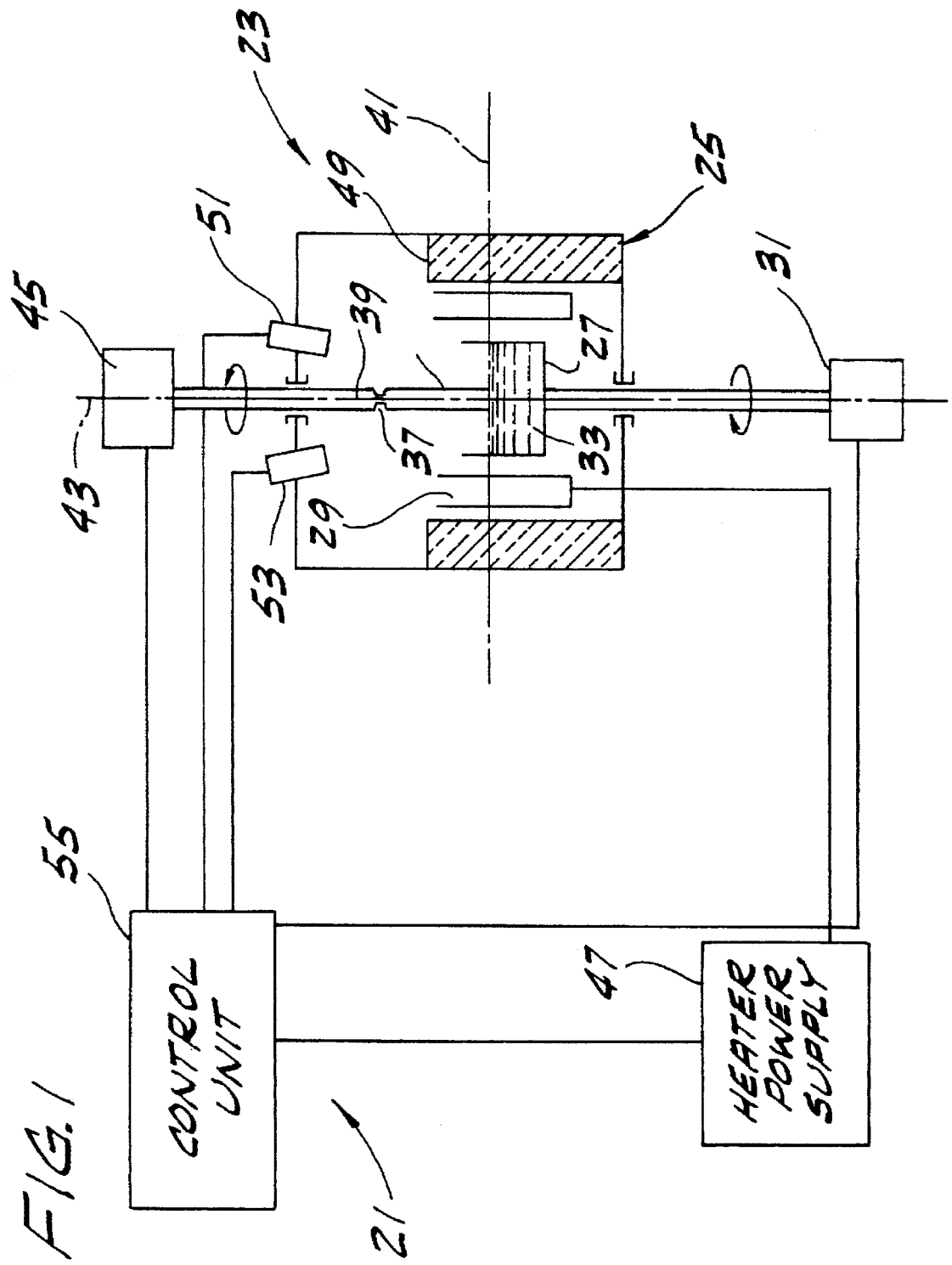
FIG. 1 illustrates of a crystal growing apparatus and a system for controlling the crystal growing apparatus according to the present invention.

Referring now to FIG. 1, a system 21 is illustrated for use with a Czochralski crystal growing apparatus 23 in accordance with the present invention. In the illustrated embodiment, the crystal growing apparatus 23 includes a vacuum chamber 25 enclosing a crucible 27 which is surrounded by a resistance heater 29 or other heating means. Generally, a crucible drive unit 31 rotates the crucible 27 in the clockwise direction, as indicated by the arrow, and raises and lowers crucible 27 as desired during the growth process. Crucible 27 contains a silicon melt 33 from which a single crystal 35 is pulled, starting with a seed crystal 37 attached to a pull shaft or cable 39. As shown in FIG. 1, the melt 33 has a melt level 41, and crucible 27 and the single crystal 35 have a common vertical axis of symmetry 43.

According to the Czochralski crystal growth process, a crystal drive unit 45 rotates the cable 39 in the opposite direction that crucible drive unit 31 rotates crucible 27. The crystal drive unit 45 also raises and lowers crystal 35 as desired during the growth process. A heater power supply 47 energizes the resistance heater 29 and insulation 49 lines the inner wall of the vacuum chamber 25. Preferably, a vacuum pump (not shown) removes gas from within vacuum chamber 25 which is replaced by an inert atmosphere of argon gas fed into vacuum chamber 25. In one embodiment, a chamber cooling jacket (not shown) fed with cooling water may surround vacuum chamber 25. Preferably, a temperature sensor 51, such as a photo cell, measures the melt surface temperature.

At least one two-dimensional camera 53 is for use with a control unit 55 to determine the diameter of single crystal 35. The control unit 55 processes signals from the temperature sensor 51 as well as the camera 53. Preferably, control unit 55 includes a programmed digital or analog computer (see FIG. 2) for use in controlling, among other things, crucible drive unit 31, single crystal drive unit 45 and the heater power supply 47.

Referring further to FIG. 1, according to a general silicon single crystal growth process, a quantity of polycrystalline silicon is charged to crucible 27. Heater power supply 47 provides electric current through heater 29 to melt the charge. Crystal drive unit 45 lowers the seed crystal 37 via cable 39 into contact with the molten silicon of melt 33 contained by crucible 27. When seed crystal 37 begins to melt, crystal drive unit 45 slowly withdraws, or pulls, it from melt 33. Seed crystal 37 draws silicon from melt 33 to produce a growth of silicon single crystal 35 as it is pulled from melt 33. Before seed crystal 37 contacts melt 33, it may first be necessary to lower seed crystal 37 nearly in contact with melt 33 for preheating seed crystal 37.

Crystal drive unit 45 rotates crystal 35 at a reference rate as it is pulled from melt 33. Crucible drive unit 31 similarly rotates crucible 27 at a second reference rate, but usually in the opposite direction relative to crystal 35. Control unit 55 initially controls the withdrawal rate (i.e., pull rate) and the power supplied to heater 29 by power supply 47 to cause a neck down of crystal 35. Preferably, control unit 55 then adjusts these parameters to cause the diameter of crystal 35 to increase in a cone-shaped manner until a desired crystal diameter is reached. Once crystal 35 reaches the desired crystal diameter, control unit 55 controls the pull rate and heating to maintain constant diameter as measured by system 21 until the process approaches its end. At that point, control unit 55 causes the pull rate and heating to increase so that the diameter decreases to form a tapered portion at the end of single crystal 35.

As described above, accurate and reliable control is desired during the crystal growth process, particularly in the neck portion of crystal 35. The neck is preferably grown at a substantially constant diameter as seed crystal 37 is drawn from melt 33. For example, control unit 55 causes a substantially constant neck diameter to be maintained so that the neck diameter remains within fifteen percent of the desired diameter. As is known in the art, the top portion of the neck adjacent seed crystal 37 may contain dislocations (not shown) first introduced by the thermal shock associated with bringing the dislocation-free seed crystal 37 into contact with silicon melt 33. Excessive fluctuations in neck diameter may also cause dislocations to form.

According to a preferred embodiment of the invention, system 21 is of the type disclosed in commonly assigned application Ser. No. 08/459,765, filed Jun. 2, 1995, the entire disclosure of which is incorporated herein by reference. Also, commonly assigned U.S. Pat. No. 5,178,720, the entire disclosure of which is incorporated herein by reference, discloses a preferred method for controlling crystal and crucible rotation rates as a function of the crystal diameter.

Figure 2:
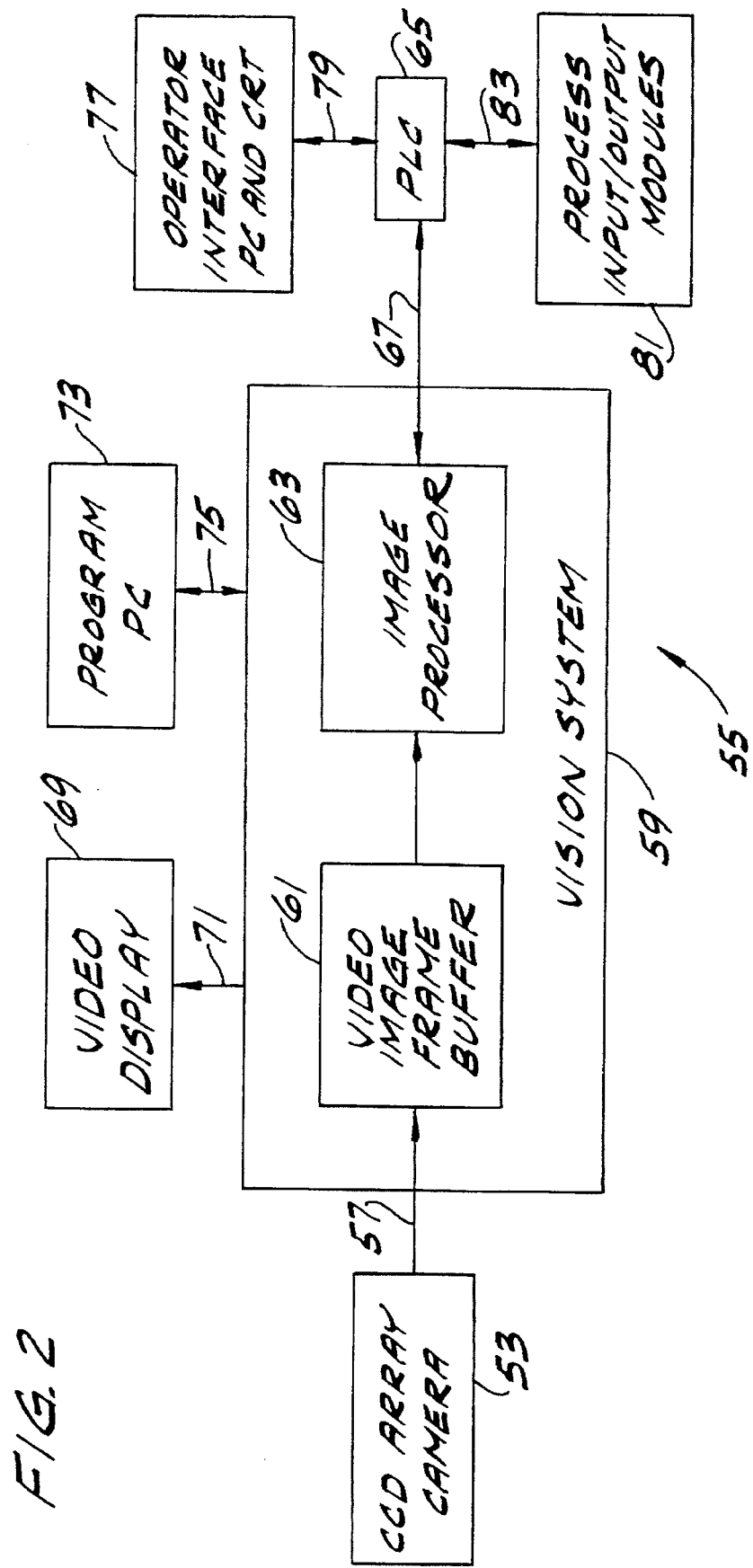
FIG. 2 is a block diagram of a control unit of the system of FIG. 1.

FIG. 2 illustrates a preferred embodiment of control unit 55 in block diagram form. According to the present invention, camera 53 is preferably a monochrome charge coupled device (CCD) camera, such as a Sony XC-75 CCD video camera having a resolution of 768×494 pixels. In the prior art, camera 53 is mounted in a viewport (not shown) of chamber 25 at an angle of approximately 34° or 35° with respect to the vertical axis 43 and is aimed generally at the intersection of axis 43 and melt 33 at the melt level 41. According to the present invention, however, camera 53 is oriented vertically so that it has an optical axis generally parallel to vertical axis 43 (see FIG. 4).

Camera 53 generates a video image of the width of crystal 35 as crystal drive unit 45 pulls it from melt 33, including an image of a portion of the meniscus (see FIG. 3) at the interface between melt 33 and crystal 35. Camera 53 communicates the video image via line 57 (e.g., RS-170 video cable) to a vision system 59. As shown in FIG. 2, the vision system 59 includes a video image frame buffer 61 and an image processor 63. As an example, vision system 59 is a Cognex CVS-400 vision system. In turn, vision system 59 communicates with a programmable logic controller (PLC) 65 via line 67. In one preferred embodiment, the PLC 65 is a Model 575 PLC manufactured by Siemens and line 67 represents a VME backplane interface.

Referring further to FIG. 2, vision system 59 also communicates with a video display 69 via line 71 (e.g., RS-170 RGB video cable) and with a personal computer 73 via line 75 (e.g., RS-232 cable). In a preferred embodiment, the video display 69 displays the video image generated by camera 53 and the computer 73 is used to program vision system 59.

In the illustrated embodiment, PLC 65 communicates with an operator interface computer 77 via line 79 (e.g., RS-232 cable) and with one or more process input/output modules 81 via line 83 (e.g., RS-485 cable). The operator interface computer 77 permits the operator of crystal growing apparatus 23 to input a set of desired parameters for the particular crystal being grown. The process input/output module 81 provides a path to and from crystal growing apparatus 23 for controlling the growth process. As an example, PLC 65 receives information regarding the melt temperature from temperature sensor 51 and outputs a control signal to heater power supply 47 via process input/output module 81 for controlling the melt temperature thereby controlling the growth process.

Figure 3:
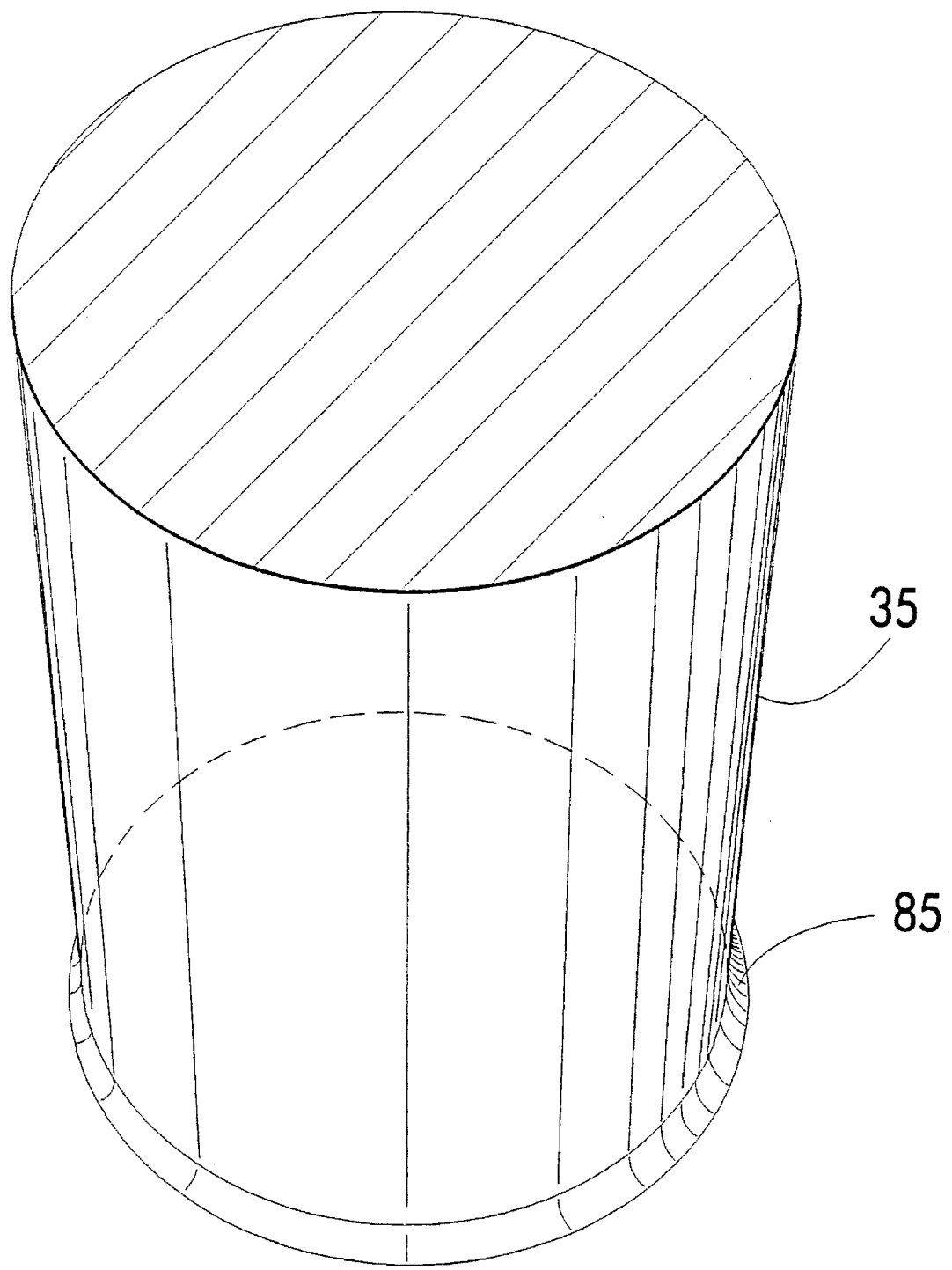
FIG. 3 is a fragmentary and cross-sectional perspective view of a silicon crystal.

Referring now to FIG. 3, an exemplary view of crystal 35, including a liquid meniscus 85 formed at the interface between crystal 35 and melt 33, is shown as viewed through the viewport of chamber 25 by a conventional camera that is tilted toward crystal 35. Thus, due to perspective distortion, the meniscus 85 does not appear circular. Rather, meniscus 85 appears to be an elliptical-type shape.

As described above, automated inspection systems and other applications of computer-based machine vision systems require accurate measurements of object edges and other features to perform their specific functions. As such, these systems must first convert measurements taken in the two-dimensional coordinate system of the camera to a three-dimensional coordinate system. FIG. 3 illustrates the disadvantageous perspective distortion caused by conventional camera systems. If the camera is tilted or panned off of the three-dimensional coordinate axes, mapping to the camera coordinate system becomes much more complex, even for objects in the same plane. Unfortunately, camera tilting or panning is often required because the camera placement is constrained by viewport locations, the need to avoid obstructions, and so forth.

Gonzalez and Wintz, *Digital Image Fundamentals*, 1987, pages 36–55, incorporated herein by reference, disclose mathematical transformations for compensating for perspective distortion caused by the position of a camera with respect to a three-dimensional object. For example, Gonzalez and Wintz teach an optimal solution to two equations with twelve unknowns using more than six three-dimensional coordinate points. Such transformations may be used to extract a circular shape from a distorted elliptical shape. Although mathematical transformations are available to compensate for perspective distortion, such transformations may be complicated and delay the performance of vision system 59.

Figure 4:
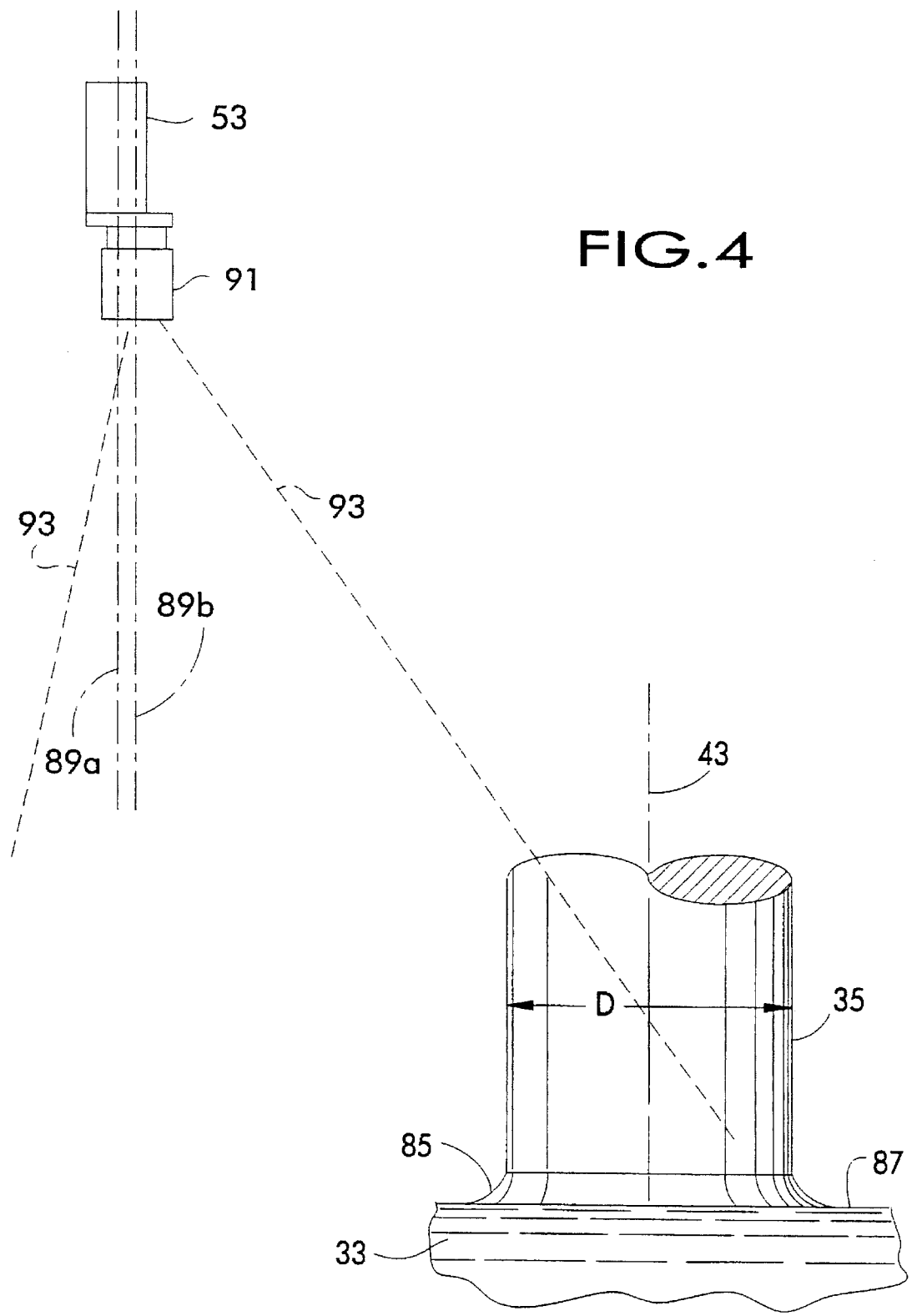
FIG. 4 is a fragmentary view of the crystal of FIG. 3 being pulled from a melt including a camera according to a preferred embodiment of the invention.

FIG. 4 is a fragmentary view of silicon crystal 35 being pulled from melt 33. As shown, crystal 35 constitutes a generally cylindrical body of crystalline silicon and is preferably an ingot of crystalline silicon having vertical axis 43 and a diameter D. It should be understood that an as-grown crystal, such as crystal 35, may not have a uniform diameter, although it is generally cylindrical. For this reason, diameter D may vary slightly at different axial positions along axis 43. Further, diameter D will vary in the different phases of crystal growth (e.g., seed, neck, crown, shoulder, body and end cone). FIG. 4 also illustrates a generally planar surface 87 of melt 33 including meniscus 85 formed at the interface between crystal 35 and melt 33. As is known in the art, the reflection of crucible 27 on meniscus 85 is typically visible as a bright ring adjacent crystal 35.

Preferably, camera 53 is mounted in a viewport (not shown) of chamber 25 in a vertical orientation. Camera 53 has a first optical axis 89a defined by its image plane (see FIG. 5) and a second optical axis 89b defined by its image projector. According to the invention, the image projector is a precision pinhole or lens for projecting an image on the surface of the image plane of camera 53. For simplicity, a lens is shown at reference character 91. In one preferred embodiment, the lens 91 of camera 53 has a focal length of approximately 17 mm providing a field of view, indicated by reference character 93, of at least approximately 300 mm. According to the invention, the field of view 93 includes the width of crystal 35 and at least a portion of the bright ring of meniscus 85. In an alternative embodiment, the image projector of camera 53 is a precision pinhole of, for example, stainless steel, and having a center aperture of approximately 173 μm.

Referring further to FIG. 4, field of view 93 of lens 91 intersects vertical axis 43 at an acute angle. For example, this angle is approximately 34° or 35°. Proper selection of lens 91 provides both telephoto viewing for high resolution of small seeds and necks as well as wide angle viewing for the larger body portion of crystal 35. Further, lens 91 is preferably selected to provide an image circle of sufficient size to accommodate the desired field of view 93 so that an image of the width of crystal 35 may be generated.

According to the invention, the vertical orientation of camera 53 aligns the image plane of camera 53 parallel to the plane of meniscus 85, i.e., parallel to melt surface 87. In this instance, the image of meniscus 85 will map linearly into the two-dimensional camera coordinate system. Advantageously, calibration takes the form of a "engineering unit per pixel" scaling that can either be calculated using known distances and focal length or determined experimentally. As stated above, if camera 53 must be tilted or panned off of the three-dimensional coordinate axes such that the image plane is not parallel to the object plane, mapping to the camera coordinate system is complex and time-consuming. Thus, camera 53 of the present invention eliminates distortion and simplifies the mapping calculations without limiting the desired field of view 93. Preferably, camera 53 provides a relatively high f-stop to achieve the maximum allowable depth of field so that the entire view remains in focus.

Figure 5:
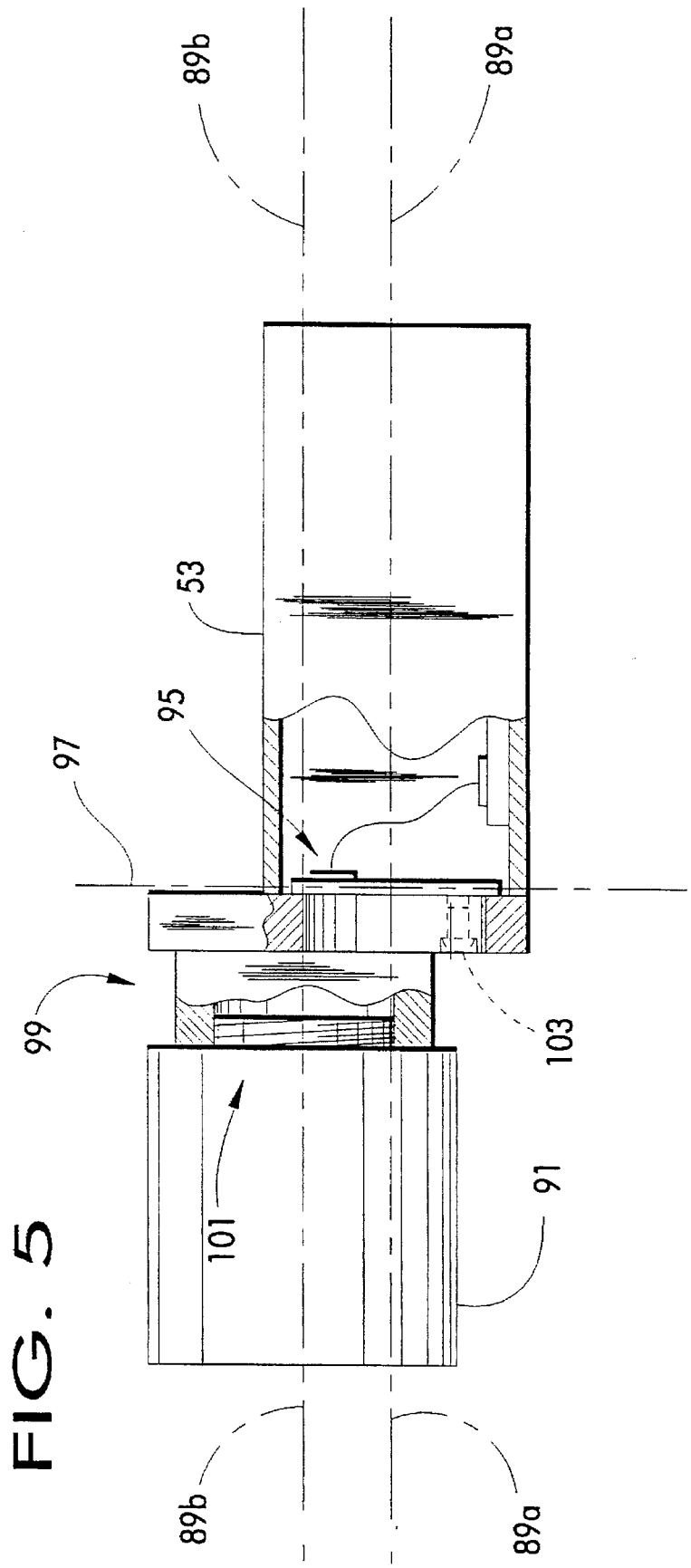
FIG. 5 is a view of the camera of FIG. 4 having portions broken away.

Referring now to FIG. 5, camera 53 advantageously provides a non-distorted image pattern according to the present invention. As shown in FIG. 5, lens 91 is offset on camera 53 relative to an image sensor assembly 95 which defines an image plane 97 of camera 53. In response to light received by lens 91 and then transmitted to the image sensor assembly 95, camera 53 generates the image pattern of the portion of the bright ring adjacent silicon crystal 35. Preferably, image sensor assembly 95 comprises a generally planar array of photosensitive receptors such as charge coupled devices.

According to the invention, a lens mount assembly 99 offsets lens 91 relative to image sensor assembly 95 so that the second optical axis 89b is generally parallel to and offset from the first optical axis 89a. The lens mount assembly 97 includes an aperture 101 (shown in phantom) for receiving lens 91 and may be constructed from at least two plates for ease of construction. In one embodiment, lens mount assembly 99 is connected to the body of camera 53 with fasteners, such as screws 103. Lens 91 and aperture 101 have corresponding threads so that lens 91 may then be screwed into aperture 101 of lens mount assembly 99. In this manner, aperture 101 is offset from first optical axis 89a of camera 53. Lens 91 and aperture 101 are both generally cylindrical in shape and share a common axis of symmetry that defines second optical axis 89b. In a preferred embodiment of the invention, image sensor assembly 95 comprises a generally planar array of photosensitive receptors in image plane 97 and which is generally perpendicular to and generally centered on first optical axis 89a. As such, image plane 97 of camera 53, as defined by image sensor assembly 95, defines first optical axis 89a which is generally parallel to and offset from vertical axis 43.

In one preferred embodiment, second optical axis 89b is offset from first optical axis 89a by approximately 3/8 inch and lens mount assembly 99 provides an extension of approximately 17 mm from camera 53 to lens 91 so that the focal point of lens 91 is properly positioned relative to image sensor assembly 95. By offsetting lens 91 in this manner, crystal 35 remains within field of view 93 of camera 53 without the need to tilt image sensor assembly 95 thereby compensating for distortion of the image pattern which would otherwise result if first optical axis 89a is at an angle relative to vertical axis 43. If a conventional camera is mounted in the viewport of chamber 25, crystal 35 lies outside the camera's field of view. By offsetting lens 91, the present invention overcomes this disadvantage.

The frame buffer 61 of vision system 59 receives the video image signal from camera 53 and captures an image pattern for processing by the image processor 63. In general, image processor 63 performs digital edge-detection to locate the coordinates of at least three points around the inside or outside of the bright ring of meniscus 85. Since the cross-section of crystal 35 and meniscus 85 is known to be generally circular, and camera 53 compensates for perspective distortion, image processor 63 maps the detected bright ring edge coordinates into a circular shape.

Image processor 63 defines at least three, and preferably five or more, regions of interest (not shown) on the image generated by camera 53 which is captured by frame buffer 61. Image processor 63 examines the regions of interest, also referred to as edge tools or window regions, for a characteristic of the image pattern, such as the intensity or gradient of the intensity of the pixels included in each region. Based on the detected characteristic of the image pattern, image processor 63 determines edge coordinates along the outside of the bright ring of meniscus 85. Preferably, the window regions are defined at preselected positions that generally correspond to positions along a curve matching the expected shape of the bright ring as viewed by camera 53. In other words, the regions are positioned radially with respect to a defined center point along the bottom half of a circle to approximate the shape of the bright ring. By defining the window regions at preselected positions approximating the shape of a portion of the bright ring, the regions avoid known or expected reflections on the surface 85 of melt 33 that might cause spurious measurements. Also, since image processor 63 defines a number of regions, if part of the viewport of chamber 25 is blocked, image processor 63 is still able to detect the edges of the bright ring. It is to be understood that other characteristics of the image pattern, such as color or contrast, may be detected for finding edge coordinates of the bright ring of meniscus 85 in addition to intensity or intensity gradient.

As described above, crystal drive unit 45 pulls crystal 35 from melt 33 generally along vertical axis 43 which is generally perpendicular to melt surface 87. During pulling, crystal 35 may move relative to vertical axis 43. Advantageously, the window regions are large enough so that edge coordinates of the bright ring may be defined within them even though crystal 35 is moving. Image processor 63 further dynamically moves the preselected positions of the window regions so that they are adjacent the imaged portion of the bright ring to follow the crystal diameter throughout all phases of growth (e.g., seed, neck, crown, shoulder, body and end cone). In other words, the regions track crystal diameters from approximately 4 mm to 300 mm. As is known in the art, however, the bright ring is not always visible during all phases of growth. For example, during growth of the crown portion of crystal 35, the bright ring may be relatively small or not visible. For this reason, system 21 preferably detects the perimeter of the crown which appears as a bright area relative to the intensity of the background of the image pattern. In this instance, the background of the image pattern is representative of melt surface 87. Thus, in the alternative to detecting the bright ring, system 21 detects the bright area associated with the crown of crystal 35.

In a preferred embodiment, image processor 63 defines a generally circular shape having a diameter and a center point based on the detected coordinates. Practically, at least three edge coordinates are needed to define such a circle. In order to obtain an accurate measurement of the crystal diameter D for use by PLC 65 in controlling the crystal growth process, image processor 63 first digitally processes the diameter of the defined circle. In this manner, image processor 63 uses the dimensions of the defined circle to determine the crystal diameter D, a measure of the quality of fit relative to an exact circle, and melt level 41. For purposes of this application, melt level 41 is defined as the distance from the top of heater 29 to surface 87 of melt 33 and may be determined as a function of the coordinates of the circle's center point.

In operation, image processor 63 defines the window regions adjacent the portion of the bright ring and detects an intensity gradient characteristic of the image pattern within them. Image processor 63 further defines the coordinates of an edge of the bright ring within each window region as a function of the detected characteristic and defines a generally circular shape including the defined edge coordinates. The diameter of crystal 35 is then determined based on the diameter of the defined circular shape for use in controlling the crystal growth process. PLC 65 of control unit 55 is responsive to the determined diameter D of silicon crystal 35 for controlling the rates at which crucible 27 and crystal 35 are rotated and/or the rate at which crystal 35 is pulled from melt 33 and/or the temperature of melt 33 and is responsive to the determination of melt level 41 for controlling the level of crucible 27 thereby to control crystal growth apparatus 23. Thus, image processor 63 constitutes a detection circuit, a defining circuit and a measurement circuit.

In one preferred embodiment of the invention, processor 63 uses a calibration factor for correcting the diameter of the defined circle, which is measured in terms of radius pixels, to compensate for the width of the bright ring. The value of the calibration factor may be determined by analyzing data from grown necks and input by an operator. According to the invention, the operator of crystal growth apparatus 23 measures the growing crystal 35 with a telescope that slides on a calibrated track and then inputs a calibration factor value via computer 77 so that the determined diameter of crystal 35 equals the measured value. In this manner, the calibration factor compensates for variability in the diameter measurement. Such variability is due primarily to changes in the distance between camera 53 and crystal 35 which affect the magnification of the optics. Increasing the distance causes crystal 35 to appear smaller which may result in the actual crystal 35 being grown oversized. These changes in distance can occur from one crystal growth apparatus 23 to another, from one run to another, and even within a single run because of variability in melt level 41.

With respect to melt level 41, image processor 63 determines a center point of the defined circle which is indicative of melt level 41. According to the invention, the difference between the y coordinate of the center point and a reference value is used to determine melt level 41. Alternatively, commercially available optical methods (e.g., a light beam/detector apparatus mounted on the cover plate of chamber 25) may be used to determine melt level 41. The determination of melt level 41 may be used to reduce variability of diameter measurements by the calculation of a correction factor and by reducing melt level variation through lift control of crucible 27.

Another primary source of variability in the diameter measurements is that the width of the bright ring changes depending on the height of the hot wall of crucible 27 which is exposed and reflected by liquid meniscus 85. As melt 33 is depleted, the width of the bright ring increases which causes crystal 35 to appear larger and may result in the actual crystal 35 being grown undersized. As an alternative to using a constant calibration factor, the bright ring width can be calculated by using additional vision tools or mathematical modeling. For example, detecting the edge between crystal 35 and the bright ring, in addition to detecting the edge between melt 33 and the bright ring, provides a measure of bright ring width. Further, mathematical modeling of liquid meniscus 85 taking into account its reflective characteristics with respect to crucible wall height, provides a measure of bright ring width.

In an alternative embodiment, the five edge coordinates of the bright ring defined within the window regions of the image pattern are used to detect periodic deviations in crystal diameter with respect to the rate at which crystal drive unit 45 rotates crystal 35. As is known in the art, <100> zero dislocation growth is indicated by facets, or growth lines, generally parallel to vertical axis 43 and spaced apart along the body of crystal 35. These growth lines appear as dimple-like features on the perimeter of a cross-section of crystal 35. For this reason, as crystal 35 rotates at a known rate, growth lines are expected within a particular window region at a rate of four times, for example, the rate of rotation. As such, image processor 63 confirms zero dislocation growth of crystal 35 and constitutes means for detecting periodic deviation in the determined diameter of the defined circular shape.

Further, it is to be understood that vision system 59 of the present invention may be used to determine other crystal growth parameters, such as purge tube gap or melt gap, complete meltdown, ice, convection currents and temperature, in addition to crystal diameter, melt level and loss of zero dislocation growth.

Figure 6:
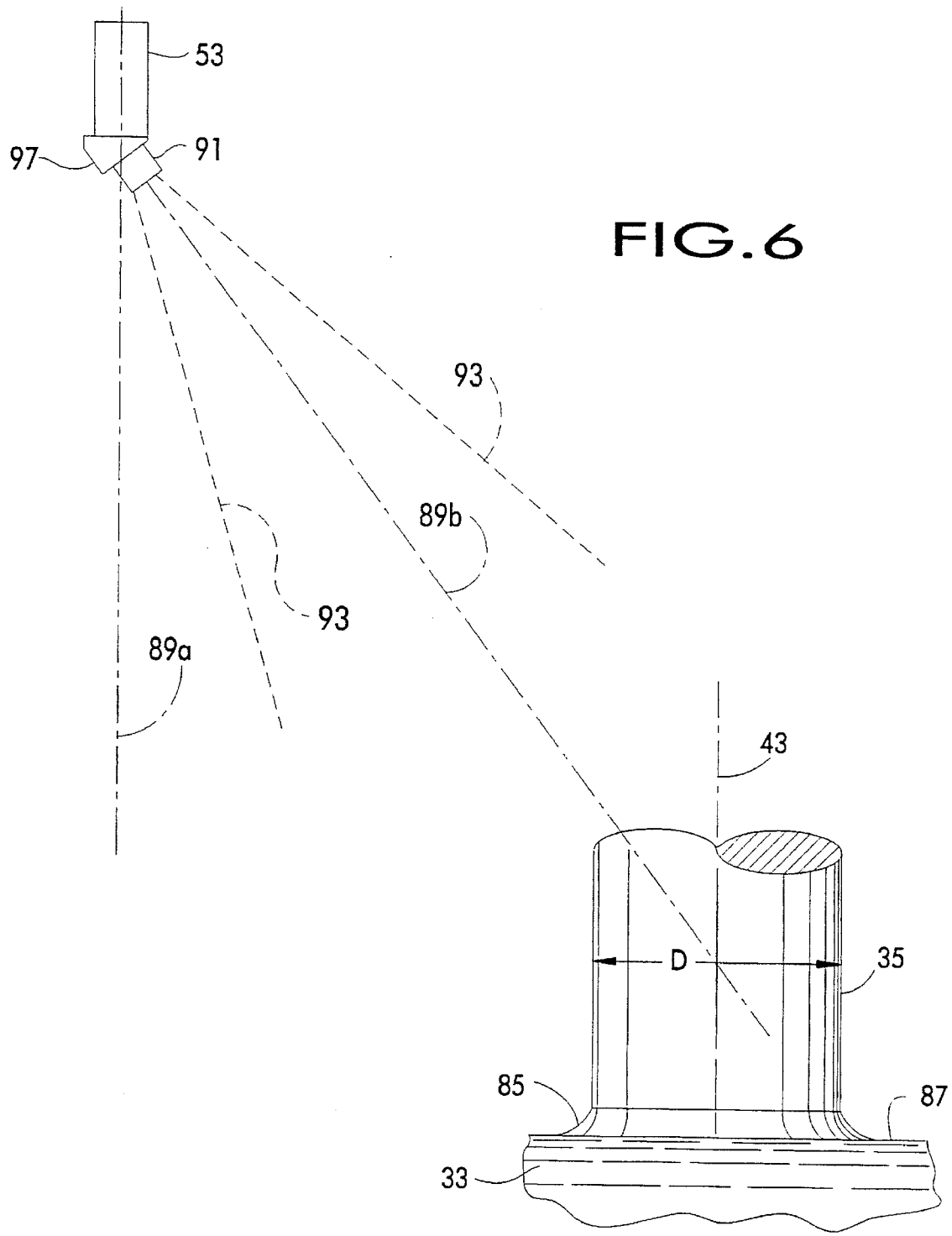
FIG. 6 is a fragmentary view of the crystal of FIG. 3 being pulled from a melt including a camera according to another preferred embodiment of the invention.

Referring now to FIG. 6, in an alternative embodiment of the invention, lens mount assembly 97 essentially rotates lens 91 relative to image sensor assembly 95. In this embodiment, camera 53 is oriented vertically so that image sensor assembly 95 is parallel to melt surface 87. Lens mount assembly 97 provides a connection for lens 91 such that second optical axis 89b, defined by lens 91, is at an acute angle relative to vertical axis 43. Again, camera 53 compensates for perspective distortion because image sensor assembly 95 is parallel to melt surface 87 and, thus, simplifies the mapping calculations.

In yet another embodiment of the invention, camera 53 has an adjustable image plane which may be aligned to be parallel to melt surface 87 to compensate for the distortion otherwise resulting when lens 91 of camera 53 is at an angle relative to vertical axis 43.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A system for use in combination with an apparatus for growing a silicon crystal from a silicon melt, said system for determining a dimension of the silicon crystal being pulled from the silicon melt, said silicon melt having a substantially planar surface including a meniscus that is visible as a bright area adjacent the silicon crystal, said system comprising:

a camera positioned above the silicon melt surface and away from the silicon crystal for generating an image pattern of a portion of the bright area adjacent the silicon crystal, said camera including an image projector for receiving and transmitting light from the bright area adjacent the silicon crystal and an image plane responsive to the light transmitted by the image projector for generating the image pattern of the portion of the bright area adjacent the silicon crystal, said image plane being substantially parallel to the silicon melt surface thereby to compensate for distortion of the image pattern caused by the position of the camera relative to the silicon crystal;

a detection circuit for detecting a characteristic of the image pattern;

a defining circuit for defining an edge of the bright area as a function of the detected characteristic and for defining a shape including the defined edge of the bright area; and a measurement circuit for determining a dimension of the defined shape whereby the dimension of the silicon crystal is determined as a function of the determined dimension of the defined shape.

2. The system of claim 1 wherein the image plane comprises a substantially planar photosensitive surface defining a first optical axis substantially perpendicular to the photosensitive surface.

3. The system of claim 2 wherein the image projector comprises a lens defining a second optical axis through its center and further comprising a lens mount for offsetting the lens of the camera relative to the image plane so that the second optical axis is generally parallel to and offset from the first optical axis.

4. The system of claim 3 wherein the second optical axis is offset from the first optical axis by approximately ⅜ inch.

5. The system of claim 2 wherein the image projector defines a second optical axis through its center and further comprising a mount for rotating the image projector of the camera relative to the image plane so that the second optical axis is at an acute angle relative to the first optical axis and is directed at the bright area adjacent the silicon crystal.

6. The system of claim 5 wherein the acute angle of the second optical axis relative to the first optical axis is approximately 35°.

7. The system of claim 1 wherein the silicon crystal is pulled from the silicon melt along a vertical axis, said vertical axis being within the meniscus and substantially perpendicular to the silicon melt surface, and wherein the camera is positioned away from the vertical axis.

8. The system of claim 1 wherein the silicon crystal is substantially cylindrical and the bright area is substantially ring-shaped and wherein the defined shape is substantially circular and the dimension of the defined shape determined by the measurement circuit is the diameter of the defined circular shape.

9. A system for use in combination with an apparatus for growing a silicon crystal from a silicon melt, said system for determining a dimension of the silicon crystal being pulled from the silicon melt, said silicon melt having a substantially planar surface including a meniscus that is visible as a bright area adjacent the silicon crystal, said silicon crystal being pulled from the silicon melt along a vertical axis within the meniscus which is substantially perpendicular to the silicon melt surface, said system comprising:

a camera positioned above the silicon melt surface and away from the vertical axis for generating an image pattern of a portion of the bright area adjacent the silicon crystal, said camera including an image projector for receiving and transmitting light from the bright area adjacent the silicon crystal and an image plane responsive to the light transmitted by the image projector for generating the image pattern of the portion of the bright area adjacent the silicon crystal, said camera having an optical axis that is substantially parallel to the vertical axis thereby to compensate for distortion of the image pattern caused by the position of the camera relative to the vertical axis;

a detection circuit for detecting a characteristic of the image pattern;

a defining circuit for defining an edge of the bright area as a function of the detected characteristic and for defining a shape including the defined edge of the bright area; and a measurement circuit for determining a dimension of the defined shape whereby the dimension of the silicon crystal is determined as a function of the determined dimension of the defined shape.

10. The system of claim 9 wherein the image projector comprises a lens defining the optical axis through its center.

11. The system of claim 10 wherein the image plane is substantially parallel to the silicon melt surface and further comprising a lens mount for offsetting the lens of the camera relative to the image plane so that the optical axis is offset from the center of the image plane.

12. The system of claim 11 wherein the optical axis is offset from the center of the image plane by approximately ⅜ inch.

13. The system of claim 9 wherein the image plane comprises a substantially planar photosensitive surface and wherein the optical axis is defined to be substantially perpendicular to the photosensitive surface.

14. The system of claim 13 further comprising a mount for rotating the image projector of the camera relative to the image plane so that the image projector is directed at the bright area adjacent the silicon crystal.

15. The system of claim 14 wherein the image projector is at an acute angle relative to the optical axis of approximately 35°.

16. The system of claim 9 wherein the silicon crystal is substantially cylindrical and the bright area is substantially ring-shaped and wherein the defined shape is substantially circular and the dimension of the defined shape determined by the measurement circuit is the diameter of the defined circular shape.

17. A system for growing a silicon crystal from a silicon melt, said system comprising:

an apparatus for pulling the silicon crystal from the silicon melt, said silicon melt having a substantially planar surface including a meniscus that is visible as a bright area adjacent the silicon crystal as the silicon crystal is pulled from the silicon melt;

a camera positioned above the silicon melt surface and away from the silicon crystal for generating an image pattern of a portion of the bright area adjacent the silicon crystal, said camera including an image projector for receiving and transmitting light from the bright area adjacent the silicon crystal and an image plane responsive to the light transmitted by the image projector for generating the image pattern of the portion of the bright area adjacent the silicon crystal, said image plane being substantially parallel to the silicon melt surface thereby to compensate for distortion of the image pattern caused by the position of the camera relative to the silicon crystal;

a detection circuit for detecting a characteristic of the image pattern;

a defining circuit for defining an edge of the bright area as a function of the detected characteristic and for defining a shape including the defined edge of the bright area; and a measurement circuit for determining a dimension of the defined shape whereby the dimension of the silicon crystal is determined as a function of the determined dimension of the defined shape, wherein said apparatus is responsive to the measurement circuit for growing the silicon crystal from the silicon melt as a function of the determined dimension of the silicon crystal.

* * * * *